(12) United States Patent
Gune et al.

(10) Patent No.: US 6,483,102 B1
(45) Date of Patent: Nov. 19, 2002

(54) METHOD AND APPARATUS FOR INSPECTION OF MISPLACED INTEGRATED CIRCUITS IN A TRAY STACK

(75) Inventors: Rahul V. Gune; Youthachai Bupparit, both of Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 09/618,763

(22) Filed: Jul. 18, 2000

(51) Int. Cl.[7] .............................................. G06M 7/00

(52) U.S. Cl. .................. 250/221; 250/559.3; 356/237.1

(58) Field of Search ............................ 250/221, 222.1, 250/223 R, 224, 559.33, 559.34, 559.3, 559.37, 548; 356/237.1

(56) References Cited

U.S. PATENT DOCUMENTS

| | | | | |
|---|---|---|---|---|
| 5,239,182 A | * | 8/1993 | Tateyama et al. | 250/561 |
| 5,674,048 A | * | 10/1997 | Rich | 414/797.5 |
| 5,906,469 A | * | 5/1999 | Oka et al. | 414/416 |
| 6,060,721 A | * | 5/2000 | Huang | 250/559.4 |
| 6,111,246 A | * | 8/2000 | Watanabe et al. | 250/222.1 |
| 6,208,909 B1 | * | 3/2001 | Kato et al. | 700/218 |

* cited by examiner

*Primary Examiner*—Kevin Pyo
*Assistant Examiner*—Seung C Sohn

(57) ABSTRACT

A method and apparatus are provided for fast and thorough inspection of tray stacks for misplaced ICs that is not susceptible to human error and prevents shipment of damaged ICs to users. Embodiments include an inspection apparatus, such as at a conventional strapping machine, comprising a number of photoelectric sensors near the corners of the trays of the stack. The sensors are moved, as by pneumatic cylinders, such that each sensor scans all of the trays in the stack, one tray at a time, while directing a beam of light at the tray and receiving a quantity of the light of the beam reflected from the stack. The received quantity of light is compared to an expected reference quantity of light corresponding to a tray without any misplaced ICs, and a signal is generated and sent to a processor based on this comparison. If the received quantity of light closely matches the reference quantity, a signal is sent to the processor indicating the tray has no misplaced ICs, and the processor enables the strapping operation. On the other hand, if the received quantity of light does not closely match the reference quantity, a signal is sent to the processor indicating a tray has a misplaced IC, and the processor generates an alarm signal, such as a red light, and disables the strapping operation. The operator can then correctly position the misplaced IC in its tray. The inspection procedure is then repeated, and the tray stack is strapped for shipping if no other misplaced ICs are found. Since performance of the strapping operation is prevented if a misplaced IC is found, damage to ICs incurred by strapping tray stacks with misplaced ICs, such as bent leads, is eliminated, and shipment of damaged ICs to customers is prevented.

15 Claims, 3 Drawing Sheets

METHOD AND APPARATUS FOR INSPECTION OF MISPLACED INTEGRATED CIRCUITS IN A TRAY STACK

FIELD OF THE INVENTION

The present invention relates to an inspection system for packaged integrated circuits. The present invention has particular applicability in inspecting stacked integrated circuit packages prior to shipping the stacks to users.

BACKGROUND ART

Conventional packages for semiconductor devices, also known as integrated circuits ("ICs"), include thin small outline packages (TSOPs) having leads, or ball grid array packages (BGAs) having attached solder balls. Typically, packaged ICs are electrically tested, then placed in JEDEC standard plastic trays having an array of pockets for holding the devices, such as an 8×12 array of ICs. For example, 10 trays may be filled with ICs and stacked, with an empty tray put on top. The stack of trays is then strapped together, as with four plastic straps.

The stack is then transported to a marking station, where an operator removes the straps. The trays are automatically singulated, the ICs are marked, and the trays are automatically re-stacked (i.e., 10 full trays plus the empty tray on top). Next, the leads or solder balls are inspected at an inspection station, and the inspected ICs are then baked in an oven, such as at about 125 degrees Centigrade for about 4 hours, depending on the package type. After the trays cool, the stacks are separated into stacks of about 5 trays. The trays are visually inspected by an operator for ICs that are misplaced in the trays (i.e., not seated properly in the pockets), and then strapped again, as by an automated strapping machine, and packed for shipping to a user.

Disadvantageously, operator error during visual inspection is time-consuming, and allows tray stacks with misplaced ICs to be strapped and shipped to the user, resulting in the user receiving damaged ICs with bent leads, non-planar leads, etc.

There exists a need for a method and apparatus for quickly and reliably inspecting stacked trays for misplaced ICs, thereby reducing manufacturing costs and preventing damaged ICs from being shipped to the user.

SUMMARY OF THE INVENTION

An advantage of the present invention is a method and apparatus for fast and thorough inspection of tray stacks for misplaced ICs that is not susceptible to human error and prevents shipment of damaged ICs to users.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by an apparatus for inspecting a stack of trays containing articles, each tray having a plurality of pockets, each pocket being for holding one of the articles in a predetermined position, the apparatus comprising a sensor, movably mounted adjacent to the stack, for generating a first signal when the articles in one of the trays are in the predetermined position, and for generating a second signal when one of the articles in one of the trays is not in the predetermined position; a motor for moving the sensor relative to the trays; and a processor for generating an alarm responsive to the second signal.

Another aspect of the present invention is method of inspecting a stack of trays containing articles, each tray having a plurality of pockets, each pocket being for holding one of the articles in a predetermined position, the method comprising providing a sensor, movably mounted adjacent to the stack, for generating a first signal when the articles in one of the trays are in the predetermined position, and for generating a second signal when one of the articles in one of the trays is not in the predetermined position; moving the sensor relative to the trays; and generating an alarm responsive to the second signal.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for inspecting stacked ICs employ visual inspection by an operator, which is time-consuming and susceptible to human error. The present invention addresses and solves these problems stemming from conventional manual inspection processes.

According to the present invention, an apparatus for inspecting a stack of trays holding ICs is included in a conventional strapping machine, and comprises a number of sensors, such as photoelectric sensors, near the corners of the trays of the stack to be strapped. The sensors are moved, as by pneumatic cylinders, such that each sensor scans all of the trays in the stack, one tray at a time, while directing a beam of light at the tray and receiving a quantity of the light of the beam reflected from the stack. The received quantity of light is compared to an expected reference quantity of light corresponding to a tray without any misplaced ICs, and a signal is generated and sent to a processor based on this comparison. If the received quantity of light closely matches the reference quantity, a signal is sent to the processor indicating the tray has no misplaced ICs. The processor enables the strapping operation after all the trays in the stack are scanned and found to have no misplaced ICs. On the other hand, if the received quantity of light from one or more of the trays does not closely match the reference quantity, a signal is sent to the processor indicating a tray has a misplaced IC, and the processor generates an alarm signal, such as a red light, and disables the strapping operation. The operator can then correctly position the misplaced IC in its tray. The inspection procedure is then repeated, and the tray stack is strapped for shipping if no misplaced ICs are found.

Thus, the present invention inspects each tray prior to strapping the tray stack, and prevents performance of the strapping operation if a misplaced IC is found. Damage to ICs incurred by strapping tray stacks with misplaced ICs, such as bent leads, is thereby eliminated, and shipment of damaged ICs to customers is prevented. Moreover, inspection time is reduced, thereby reducing manufacturing costs and increasing production throughput.

Figure 1:
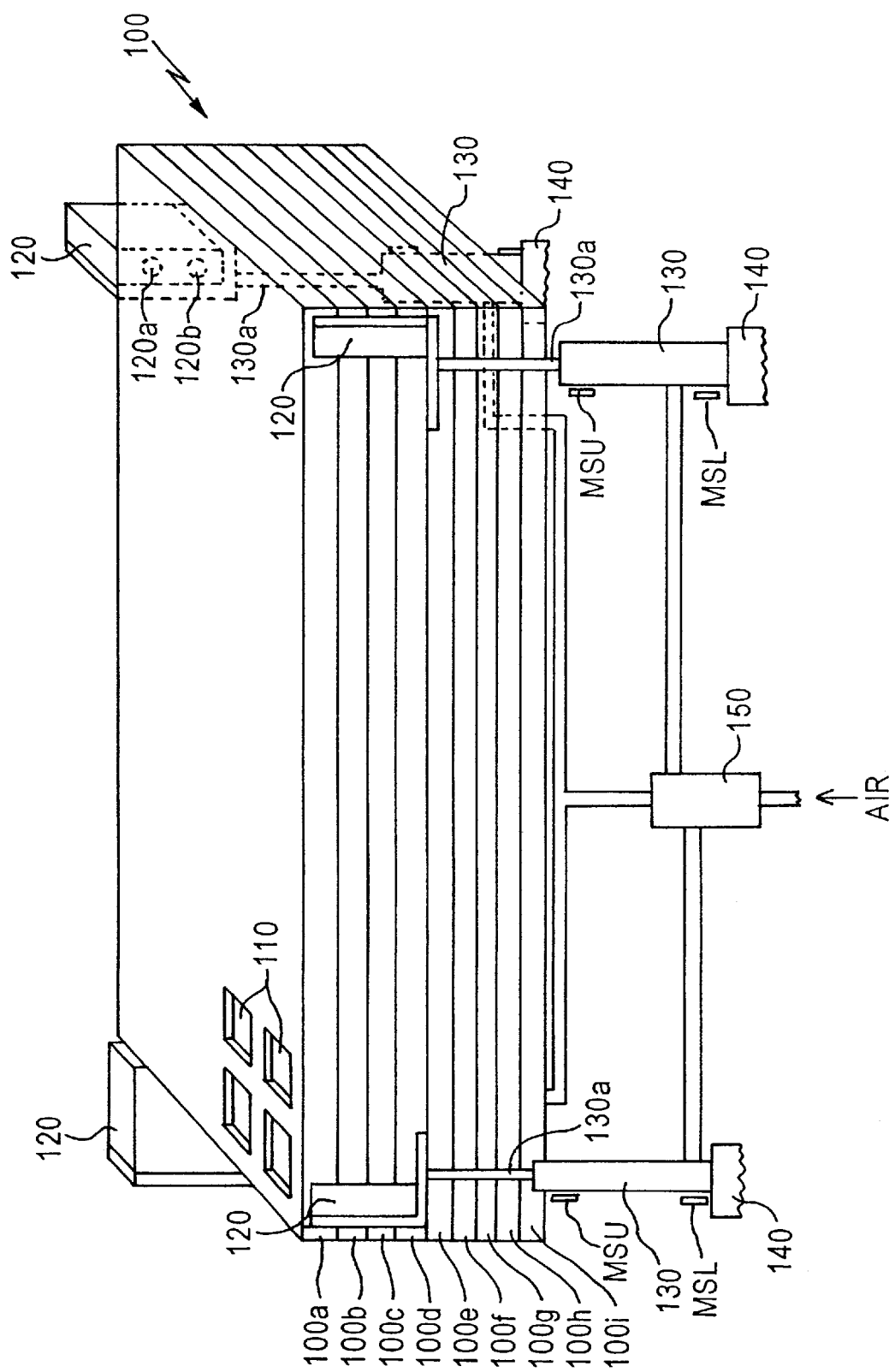
FIG. 1 illustrates an inspection apparatus according to an embodiment of the present invention.
Figure 2:
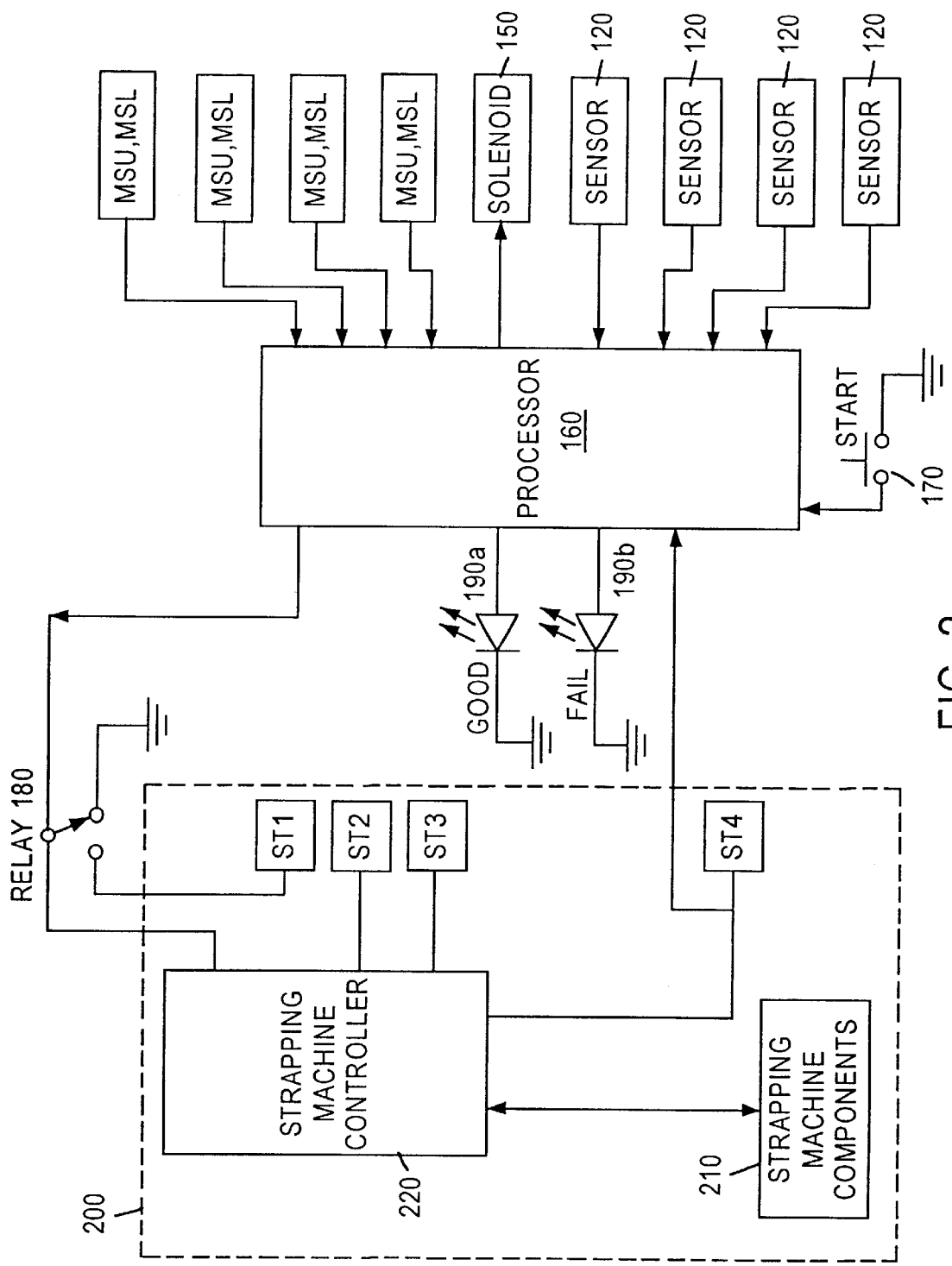
FIG. 2 is a schematic diagram of an inspection apparatus according to an embodiment of the present invention.

An apparatus according to an embodiment of the present invention will now be described with reference to FIGS. 1 and 2. The inspection apparatus of this embodiment of the present invention is implemented at a conventional strapping machine 200, such as a Model S669 strapping machine, available from Strapback Corp. of Tokyo, Japan, comprising strappers ST1–ST4, other components 210 such as motors, brakes, etc., and an electronic controller 220. The present invention is for inspecting a stack 100 of identical trays 100a–100i, such as JEDEC standard plastic trays, each having a substantially rectangular outline and an array of pockets 110 for holding ICs (not shown). Note that tray 100a typically does not contain ICs, and is used as a cap to protect the ICs in tray 100b. Sensors 120, such as conventional one touch calibration photoelectric sensors with PS47 sensor heads, available from Keyence Corporation of America of Woodcliff Lake, N.J., are preferably located proximal to the four corners of tray stack 100. Each sensor 120 comprises a light source 120a for directing a beam of light at stack 100 and a receiver 120b for receiving a quantity of the light reflected from the stack. Each sensor 120 further comprises circuitry (not shown) for comparing the quantity of reflected light received by receiver 120b with a predetermined light quantity corresponding to a tray 100a–100i without any misplaced ICs. The circuitry of sensors 120 generate a first signal when the received light quantity substantially matches the predetermined light quantity (corresponding to no misplaced ICs in the tray being scanned), and generate a second signal when the received light quantity does not substantially match the predetermined light quantity (corresponding to a misplaced IC which causes the tray above it to be out of alignment). The first and second signals are provided to a processor 160 that controls the apparatus of the present invention, such as a Model AT89C2051 Microcontroller available from Atmel Ltd. of San Jose, Calif.

Sensors 120 are movably mounted relative to stack 100 on motors such as standard pneumatic cylinders 130, which are provided compressed air from an air source (not shown), such as conventional shop air, via a conventional electric solenoid valve 150 controlled by processor 160. Cylinders 130 comprise plungers 130a for moving sensors 120 such that they each scan all trays 100a–100i in stack 100 with light source 120a and receiver 120b. Each cylinder 130 has an upper microswitch MSU and a lower microswitch MSL, such as conventional magnetic switches, for sensing the position of plunger 130a of cylinder 130. Signals from magnetic switches MSU, MSL are provided to processor 160.

The inspection apparatus also comprises a start switch 170, such as a push-button switch, a relay 180, a green light emitting diode (LED) 190a, and a red LED 190b.

Figure 3:
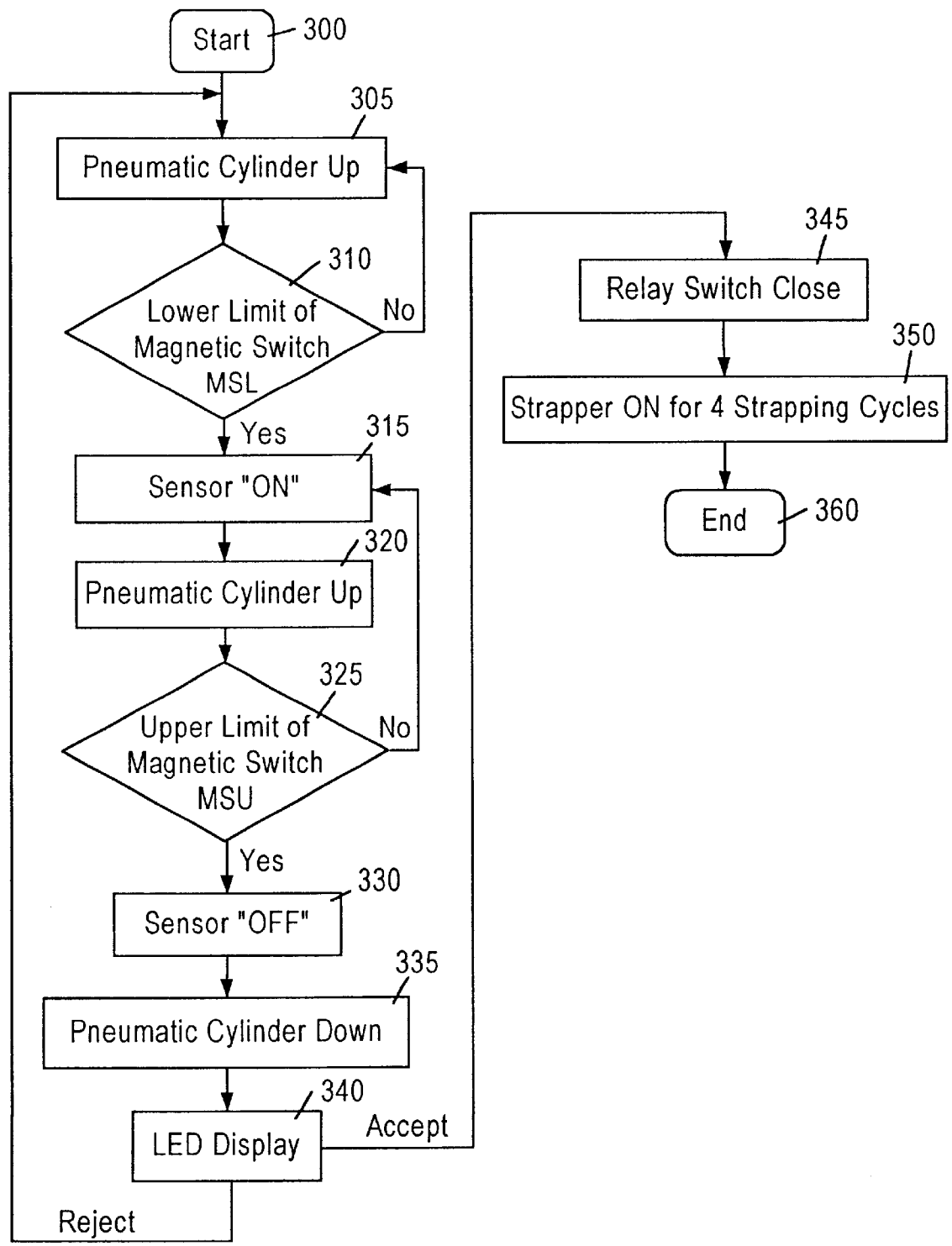
FIG. 3 is a flow chart illustrating the operation of an inspection methodology and apparatus according to an embodiment of the present invention.

The operation of the apparatus of this embodiment of the present invention will now be described with reference to the flow chart of FIG. 3. Initially, plungers 130a of cylinders 130 are at the bottom of their stroke; i.e., sensors 120 are below tray 100i. At step 300, an operator presses start switch 170, and processor 160 controls solenoid 150 to provide compressed air to cylinders 130 to drive plungers 130a upward (see step 305). When lower magnetic switches MSL sense plungers 130a (step 310), processor 160 turns on sensors 120 (step 315). Plungers 130a continue to move upward at step 320 while sensors 120 scan all trays 100a–100i and each send either the first signal (indicating no misplaced ICs) or the second signal (indicating a misplaced IC) to processor 160. When the upper limit of upper magnetic switches MSU is reached (step 325), processor 160 turns off sensors 120 (step 330) and solenoid 150, causing plungers 130a to return to their original positions (step 335).

At step 340, if the first signal (which corresponds to no misplaced ICs) was the only signal sent to processor 160 by sensors 120, processor 160 turns on green LED 190a and at step 345 closes relay 180 to enable the strapping operation. Strapping machine controller 220 then causes strappers ST1–ST4 to place four straps (not shown) on tray stack 100 at step 350. When controller 220 causes strapper ST4 to perform the last strapping cycle, it also sends a signal to processor 160, which places the apparatus back into inspection mode (step 360).

On the other hand, if the second signal (which corresponds to a misplaced IC) was sent to processor 160 by sensors 120 between steps 315 and 330, then at step 340 processor 160 turns on red LED 190b, alerting the operator that stack 100 contains a misplaced IC. Processor 160 does not close relay 180, thereby disabling the strapping operation. The operator can then inspect stack 100 and correctly position the misplaced IC. Steps 305–340 are then repeated, and if no misplaced ICs are detected, stack 100 is strapped.

The present invention eliminates visual inspection of tray stacks by an operator prior to strapping. The present invention automatically inspects the tray stack, and disables the strapping operation if any misplaced ICs are detected. Thus, the present invention eliminates problems such as bent leads and non-planar leads arising from human error during the inspection process by preventing strapping of a tray stack containing misplaced ICs.

The present invention is applicable to the manufacture of various types of packaged semiconductor devices, particularly devices comprising leads.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An apparatus for inspecting a stack of discrete trays containing articles, each tray having a plurality of pockets, each pocket being for holding one of the articles in a predetermined position, the apparatus comprising:

a sensor, movably mounted adjacent to the stack, for generating a first signal when the articles in one of the trays are in the predetermined position, and for generating a second signal when one of the articles in one of the trays is not in the predetermined position based on whether or not the stacked trays are substantially aligned relative to each other;

a motor for moving the sensor relative to the trays; and a processor for generating an alarm responsive to the second signal.

2. The apparatus of claim 1, wherein the trays have a substantially rectilinear outline, the apparatus comprising a plurality of the sensors movably mounted proximal to the corners of the trays for sending the first and second signals to the processor.

3. The apparatus of claim 1, wherein the sensor comprises a photoelectric sensor.

4. The apparatus of claim 1, wherein the motor comprises a pneumatic cylinder.

5. The apparatus of claim 1, wherein the motor is for moving the sensor such that the sensor scans all of the trays in the stack.

6. The apparatus of claim 5, wherein the processor is for controlling the motor to move the sensor.

7. The apparatus of claim 1, further comprising a strapping machine for carrying out a strapping operation on the stack of trays, wherein the processor is for preventing the strapping machine from carrying out the strapping operation responsive to the second signal.

8. The apparatus of claim 7, wherein the processor is for enabling the strapping operation responsive to the first signal.

9. The apparatus of claim 3, wherein the photoelectric sensor comprises:

a light source for directing a beam of light at the stack of trays;

a receiver for receiving a quantity of the light reflected from the stack; and a signal generator for generating the first signal or the second signal based on the quantity and a predetermined reference quantity.

10. A method of inspecting a stack of discrete trays containing articles, each tray having a plurality of pockets, each pocket being for holding one of the articles in a predetermined position, the method comprising:

providing a sensor, movably mounted adjacent to the stack, for generating a first signal when the articles in one of the trays are in the predetermined position, and for generating a second signal when one of the articles in one of the trays is not in the predetermined position based on whether or not the stacked trays are substantially aligned relative to each other; moving the sensor relative to the trays; and generating an alarm responsive to the second signal.

11. The method of claim 10, wherein the trays have a substantially rectilinear outline, the method further comprising providing a plurality of sensors proximal to the corners of the trays.

12. The method of claim 10, wherein the moving step comprises moving the sensor such that the sensor scans all of the trays in the stack.

13. The method of claim 10, comprising preventing a strapping machine from carrying out a strapping operation on the trays responsive to the second signal.

14. The method of claim 13, comprising enabling the strapping operation responsive to the second signal.

15. The method of claim 10, comprising:

directing a beam of light from the sensor at the stack;

receiving a quantity of the light reflected from the stack at the sensor; and generating the first signal or the second signal based on the quantity and a predetermined reference quantity.

* * * * *